(12) United States Patent
Mizoguchi

(10) Patent No.: US 11,644,512 B2
(45) Date of Patent: May 9, 2023

(54) BATTERY MONITORING DEVICE

(71) Applicant: DENSO CORPORATION, Kariya (JP)

(72) Inventor: Tomomichi Mizoguchi, Kariya (JP)

(73) Assignee: DENSO CORPORATION, Kariya (JP)

( * ) Notice: Subject to any disclaimer, the term of this patent is extended or adjusted under 35 U.S.C. 154(b) by 396 days.

(21) Appl. No.: 16/921,036

(22) Filed: Jul. 6, 2020

(65) Prior Publication Data

US 2021/0003638 A1 Jan. 7, 2021

(30) Foreign Application Priority Data

Jul. 4, 2019 (JP) .............................. JP2019-125476

(51) Int. Cl.
| | |
|---|---|
| *G01R 31/389* | (2019.01) |
| *G01R 31/396* | (2019.01) |
| *H02J 7/00* | (2006.01) |
| *H01M 10/48* | (2006.01) |
| *H01M 10/44* | (2006.01) |

(52) U.S. Cl.
CPC ......... *G01R 31/389* (2019.01); *G01R 31/396* (2019.01); *H01M 10/44* (2013.01); *H01M 10/48* (2013.01); *H02J 7/0014* (2013.01); *H02J 7/0047* (2013.01)

(58) Field of Classification Search
CPC ... G01R 31/389; G01R 31/396; H01M 10/44; H01M 10/48; H02J 7/0014; H02J 7/0047
USPC .......................................................... 702/63
See application file for complete search history.

(56) References Cited

U.S. PATENT DOCUMENTS

| | | | |
|---|---|---|---|
| 2016/0195577 A1 | 7/2016 | Osaka et al. | |
| 2018/0059191 A1* | 3/2018 | Abu Qahouq | G01R 31/392 |
| 2019/0079140 A1* | 3/2019 | Matsuno | G01R 31/389 |
| 2019/0293722 A1* | 9/2019 | Choi | H02J 7/00 |
| 2021/0109160 A1* | 4/2021 | Matsukawa | G01R 31/392 |
| 2021/0373081 A1* | 12/2021 | Gong | G01R 31/396 |

FOREIGN PATENT DOCUMENTS

| | | |
|---|---|---|
| JP | 2018-190502 A | 11/2018 |
| JP | 2020-180949 A | 11/2020 |

* cited by examiner

*Primary Examiner* — Aditya S Bhat
(74) *Attorney, Agent, or Firm* — Oliff PLC

(57) ABSTRACT

A battery monitoring device includes: an oscillator causing an AC signal to flow in the battery cell; a subtractor acquiring voltage fluctuation of the battery cell when the AC signal flows as a response signal; and a calculation unit calculating complex impedance. The calculation unit calculates the complex impedance based on a multiplication value X of the response signal and a first reference signal outputted in synchronization with the AC signal, and a multiplication value Y of the response signal and the second reference signal obtained by shifting the phase of the AC signal. The AC signal is a rectangular wave signal, the first reference signal is a rectangular wave signal outputted in synchronization with the AC signal, and the second reference signal is a rectangular wave signal, the phase of which is shifted so as not to be outputted overlapping with the first reference signal.

5 Claims, 12 Drawing Sheets

I (DISCHARGE DIRECTION+)

Ref1

Ref2

Va (DIRECTION OF DECREASE+)
= V − VDC

X = Va × Ref1

Y = Va × Ref2

Avarage(X)

Avarage(Y)

FIG.7A
FIG.7B
FIG.7C
FIG.7D
FIG.7E
FIG.7F
FIG.7G
FIG.7H
I (DISCHARGE DIRECTION+)
Ref1
Ref2
Va (DIRECTION OF DECREASE+)
= Va − VDC
X = Va × Ref1
Y = Va × Ref2
Avarage(X)
Avarage(Y)
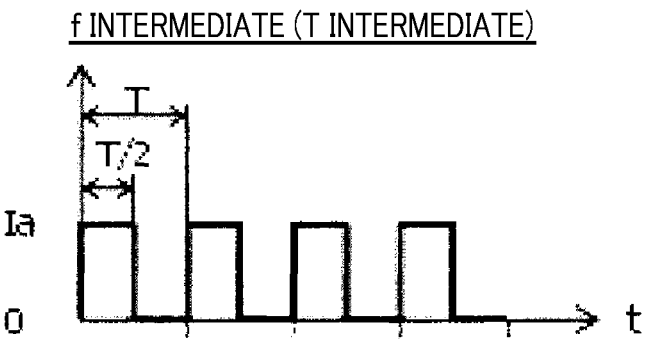
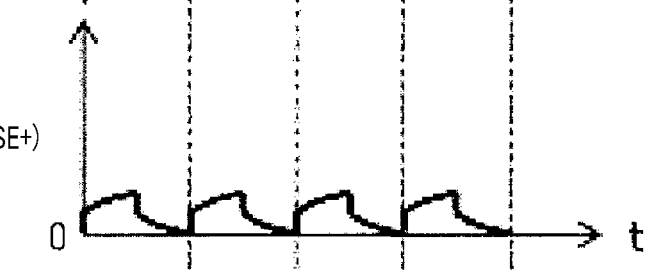
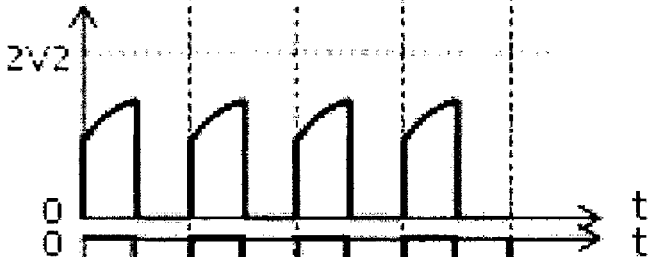

I (DISCHARGE DIRECTION+)

Ref1

Ref2

Va (DIRECTION OF DECREASE+)
= V − VDC

X = Va × Ref1

Y = Va × Ref2

Avarage(X)

Avarage(Y)

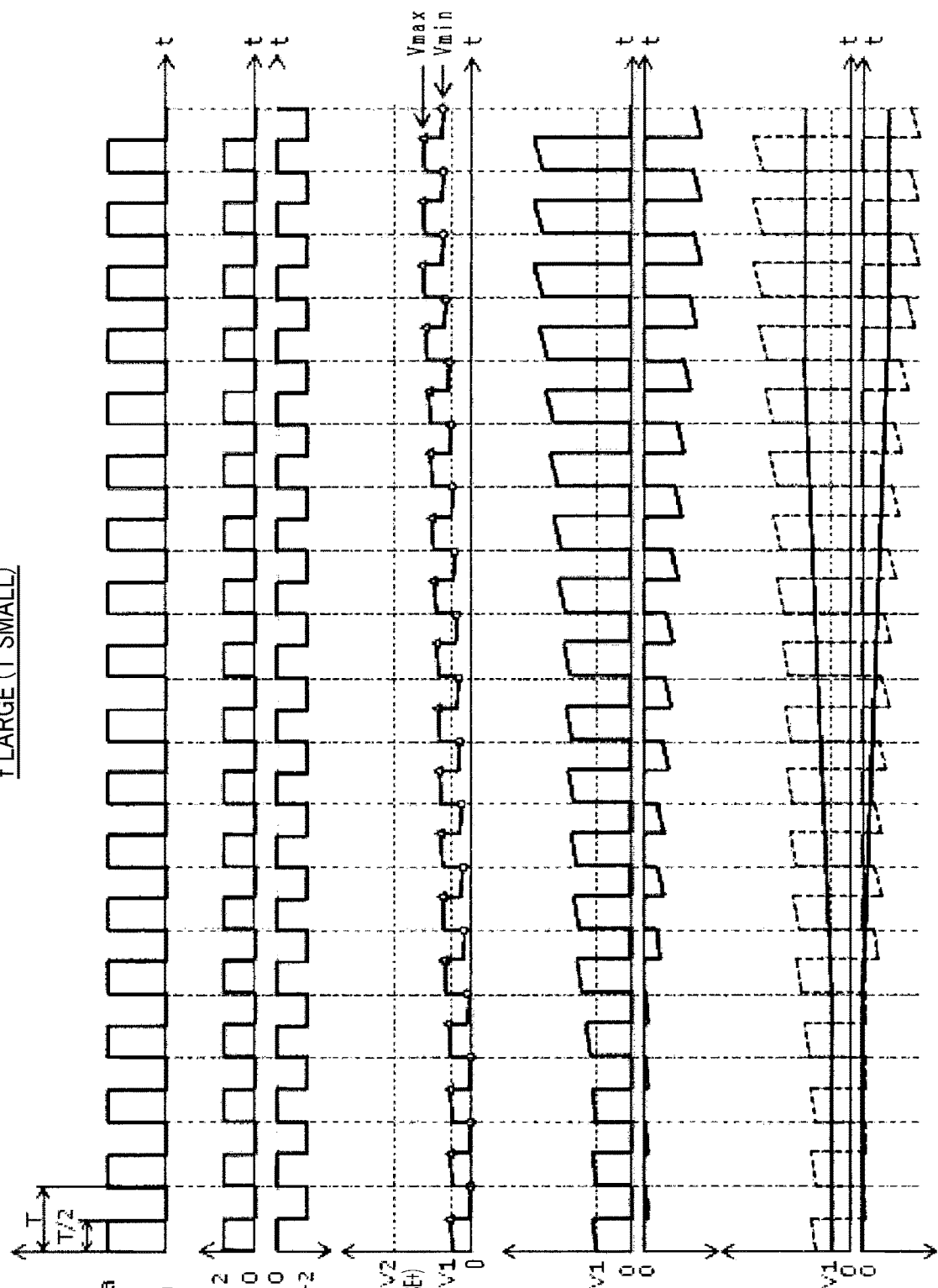

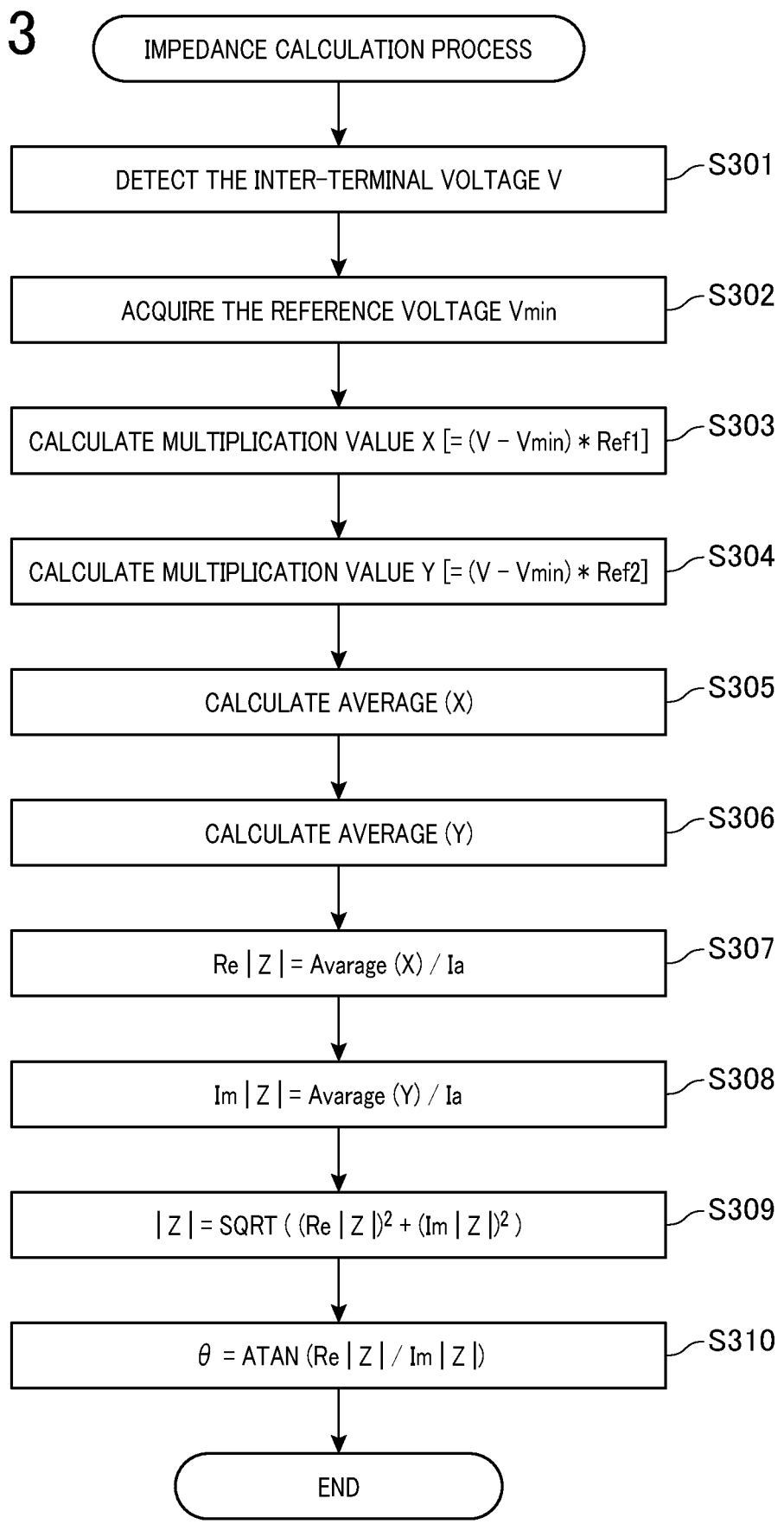

BATTERY MONITORING DEVICE

CROSS-REFERENCE TO RELATED APPLICATION

This application is based on and claims the benefit of priority from earlier Japanese Patent Application No. 2019-125476 filed Jul. 4, 2019, the description of which is incorporated herein by reference.

BACKGROUND

Technical Field

The present invention relates to a battery monitoring device.

Description of the Related Art

Conventionally, in order to monitor the state of a storage battery, the complex impedance of the storage battery is measured. As an example of such as configuration, a signal is applied to a storage battery and applies a signal processing to a response signal to calculate the complex impedance of the storage battery, whereby a deterioration state of the storage battery is determined.

SUMMARY

The present invention is to provide a battery monitoring device that may be made more compact while improving the calculation accuracy of complex impedance.

According to the present disclosure, a battery monitoring device that monitors a state of a storage battery including an electrolyte and a plurality of electrodes is provided. The battery monitoring device includes: a signal generating unit that causes an AC signal to flow in the storage battery; a response signal acquiring unit that acquires a voltage fluctuation of the storage battery when the AC signal flows as a response signal; and a calculation unit that calculates a complex impedance of the storage battery.

BRIEF DESCRIPTION OF THE DRAWINGS

In the accompanying drawings:

FIGS. 7A to 7H are timing charts illustrating changes in voltage and current when calculating complex impedance;

FIGS. 12A to 12H are timing charts illustrating changes in voltage and current when calculating complex impedance in a second embodiment; and FIG. 13 is a flowchart illustrating the flow of an impedance calculation process in a second embodiment.

DETAILED DESCRIPTION OF THE PREFERRED EMBODIMENTS

As an example of a conventional art, Japanese Patent No. 6226261 discloses a technique in which a power controller applies a rectangular wave signal to a storage battery, performs Fourier transformation of a response signal, and calculates the complex impedance characteristic from the obtained result. Then, the deterioration state or the like of the storage battery is determined based on the complex impedance characteristic.

Moreover, according to a patent literature JP 2018-190502A, a sinusoidal current is supplied from an oscillator to a storage battery, a response signal (voltage fluctuation) is detected by a lock-in amplifier, and the complex impedance characteristic is calculated based on the detection result. Then, the deterioration state or the like of the storage battery is determined based on the complex impedance characteristic.

Incidentally, in a case where these complex impedance measuring methods are adopted as a complex impedance measuring method for a vehicle-mounted storage battery, the problems described below occur. In other words, in the invention described in Japanese Patent No. 6226261, there is a problem in that the processing load for performing the Fourier transformation is large, and there is a problem in that the calculation accuracy of the complex impedance is poor because of being vulnerable to noise. In particular, when applied to a vehicle-mounted storage battery in which a lot of noise easily occurs, the impedance calculation accuracy tends to deteriorate.

On the other hand, the invention described in JP 2018-190502A has a merit in that, when compared with the invention described in Japanese Patent No. 6226261, it is more resistant to noise and the processing load is smaller than that of Fourier transformation; however, there is a problem in that an AC power supply (oscillator) for supplying a sinusoidal current is required, so the circuits tend to be large.

Hereinafter, with reference to the drawings, embodiments of the present disclosure will be described.

First Embodiment

Hereinafter, a first embodiment in which a "battery monitoring device" is applied to a power supply system of a vehicle (for example, a hybrid vehicle or an electric automobile) will be described with reference to the drawings.

Figure 1:
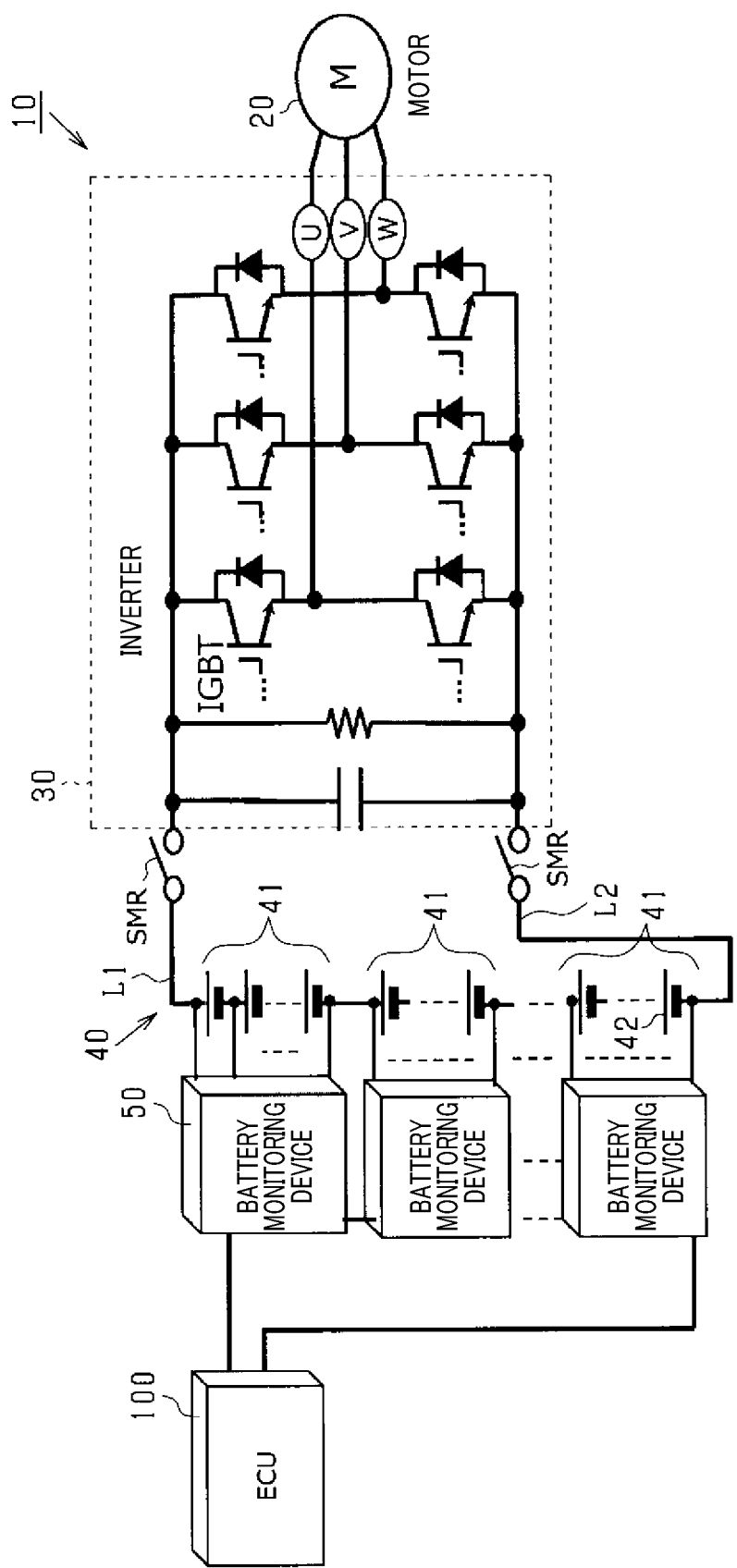
FIG. 1 is a schematic configuration diagram of a power supply system.

As illustrated in FIG. 1, a power supply system 10 includes a motor 20 as a rotating electric machine, an inverter 30 as a power converter for supplying a three-phase current to the motor 20, a chargeable/dischargeable battery pack 40, battery monitoring devices 50 that monitor the state of the battery pack 40 and an ECU 100 that controls the motor 20 and the like are provided.

The motor 20 is capable of transmitting power to drive wheels (not illustrated). In this embodiment, a three-phase permanent magnet synchronous motor is used as the motor 20.

The inverter 30 includes a full bridge circuit having the same number of upper and lower arms as the number of phases of the phase winding, and by turning ON/OFF a switch (semiconductor switching element such as IGBT or the like) provided for each arm, the energizing current is adjusted.

The inverter 30 is provided with an inverter control device (not illustrated), and the inverter control device controls energization by turning ON/OFF each switch in the inverter 30 based on various detection information of the motor 20 and requests for power-running drive and power generation. As a result, the inverter control device supplies electric power from the battery pack 40 to the motor 20 via the inverter 30 to drive the motor 20 in the power-running mode. Further, the inverter control device causes the motor 20 to generate power based on the power from the drive wheels, converts the generated power via the inverter 30 and supplies the converted power to the battery pack 40 to charge the battery pack 40.

The battery pack 40 is electrically connected to the motor 20 via the inverter 30. The battery pack 40 has an inter-terminal voltage of, for example, 100 V or more, and is configured by connecting a plurality of battery modules 41 in series. Each battery module 41 is configured by connecting a plurality of battery cells 42 in series. As the battery cell 42, for example, a lithium ion storage battery or a nickel hydrogen storage battery may be used. Each battery cell 42 is a storage battery having an electrolyte and a plurality of electrodes.

A positive electrode side terminal of an electric load such as the inverter 30 or the like is connected to a positive electrode side power-supply path L1 that is connected to a positive electrode side power-supply terminal of the battery pack 40. Similarly, a negative electrode side terminal of an electric load such as the inverter 30 or the like is connected to a negative electrode side power-supply path L2 that is connected to a negative electrode side power-supply terminal of the battery pack 40. Note that a relay switch SMR (system main relay) is provided for each of the positive electrode side power-supply path L1 and the negative electrode side power-supply path L2, and it is possible to switch between energization and energization interruption by the relay switch SMR.

The battery monitoring device 50 is a device that monitors the state of charge (SOC) and the state of deterioration (SOH) of each battery cell 42. In the first embodiment, a battery monitoring device 50 is provided for each battery cell 42. Each battery monitoring device 50 is connected to the ECU 100 and outputs the state and the like of each battery cell 42. The configuration of the battery monitoring device 50 will be described later.

The ECU 100 performs power-running drive and power generation requests to an inverter control device based on various information. The various information includes, for example, accelerator and brake operation information, vehicle speed, the state of the battery pack 40, and the like.

Figure 2:
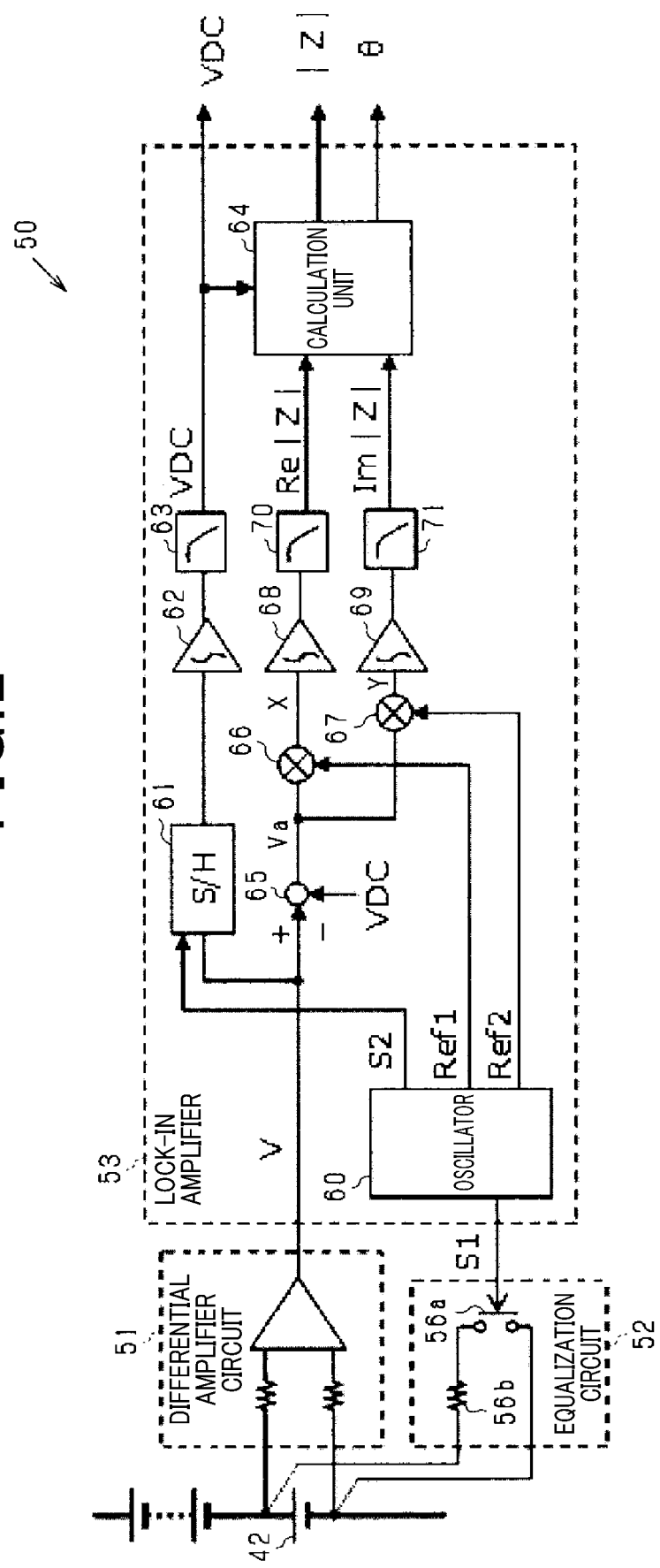
FIG. 2 is a configuration diagram of a battery monitoring device.

Next, the battery monitoring device 50 will be described in detail. As illustrated in FIG. 2, in the first embodiment, a battery monitoring device 50 is provided for each battery cell 42. Each battery monitoring device 50 includes a differential amplifier circuit 51, an equalization circuit 52, and a lock-in amplifier 53.

The differential amplifier circuit 51 is connected to the battery cell 42 to be monitored. More specifically, the differential amplifier circuit 51 has a function of inputting, amplifying, and outputting the inter-terminal voltage V of the battery cell 42. In addition, the differential amplifier circuit 51 has a function of inputting, amplifying and outputting a voltage fluctuation reflecting the internal complex impedance information of the battery cell 42 between the terminals of the battery cell 42 in a case where calculation of the complex impedance is performed by the lock-in amplifier 53. Moreover, the differential amplifier circuit 51 is connected to the lock-in amplifier 53, and is configured so as to output the inter-terminal voltage V (voltage fluctuation) inputted to the lock-in amplifier 53.

An equalization circuit 52 is connected to the battery cells 42. The equalization circuit 52 is a circuit that outputs a predetermined AC signal I (AC current) using the battery cell 42 that is the monitoring target as a power supply. Describing this in more detail, the equalization circuit 52 has a semiconductor switching element 56a (for example, MOSFET) as a switch section and a resistor 56b connected in series to the semiconductor switching element 56a. In other words, the equalization circuit 52 is a series connection body of the semiconductor switching element 56a and the resistor 56b. One end of the resistor 56b (the end on the opposite side from the connection end with the semiconductor switching element 56a) is connected to the positive terminal of the battery cell 42. In addition, one end of the semiconductor switching element 56a (the end on the opposite side from the connection end with the resistor 56b) is connected to the negative electrode terminal of the battery cell 42.

The semiconductor switching element 56a is connected to the lock-in amplifier 53, and the energization amount may be adjusted based on an instruction signal S1 from the lock-in amplifier 53. In other words, ON/OFF of the semiconductor switching element 56a is controlled based on the instruction signal S1 from the lock-in amplifier 53 so that the battery cell 42 outputs an AC signal I instructed by the instruction signal S1.

Note that the equalization circuit 52 is a circuit for performing an equalization process for equalizing the storage states and voltages of the battery cells 42. The equalization process is a process of discharging a part of the battery cells 42 having a higher storage state (or voltage) compared to other battery cells 42 so that the storage states and the voltages of the battery cells 42 are equalized. As a result, it is possible to make the power storage states and voltages of the battery cells 42 uniform and prevent a part of the battery cells 42 from being overcharged. The equalization process is performed by a control device such as a battery control ECU or the like that controls the power storage state of each battery cell 42. Note that the battery monitoring device 50 may be implemented.

Next, a summary of the lock-in amplifier 53 will be described.

The lock-in amplifier 53 has a function of acquiring the DC voltage VDC of the battery cell 42 based on the inter-terminal voltage V inputted via the differential amplifier circuit 51. In addition, the lock-in amplifier 53 has a function of instructing the equalization circuit 52 to output the AC signal I (AC current) from the battery cell 42. Moreover, the lock-in amplifier 53 has a function of inputting a voltage fluctuation that reflects the internal complex impedance information of the battery cell 42 via the differential amplifier circuit 51 when the AC signal I is outputted from the battery cell 42, and calculating the complex impedance of the battery cell 42 based on the inputted voltage fluctuation. Further, the lock-in amplifier 53 has a function of specifying a control index based on the calculated complex impedance. The lock-in amplifier 53 has a function of externally outputting various information such as complex (to the ECU 100 or the like). Details of these functions will be described later.

Here, a summary of the AC impedance method for specifying the characteristics of the storage battery will be described. In the AC impedance method, a sinusoidal current is applied to a storage battery, a voltage fluctuation when the sinusoidal current is applied is acquired as a response signal, and a complex impedance is calculated based on the response signal and the applied sinusoidal current. By scanning the frequency of the applied sinusoidal current, complex impedances (frequency characteristics of complex impedance) at a plurality of frequencies are acquired. Then, the complex impedance locus (Cole-Cole plot, Nyquist plot) that represents the frequency characteristic of the complex impedance in a complex plan view is created. The characteristics of the electrode and the electrolyte are known based on this Cole-Cole plot. For example, the state of charge (SOC) and the state of deterioration (SOH) are known.

However, in a case where a sinusoidal current is applied to the storage battery by adopting a method such as described above, there is a problem in that the oscillator for outputting the sinusoidal current becomes large. In particular, in a case of an on-vehicle storage battery, since the storage battery has a large capacity, there is a problem in that the frequency range for scanning becomes large and the oscillator for outputting a sinusoidal current tends to be large.

Figure 3:
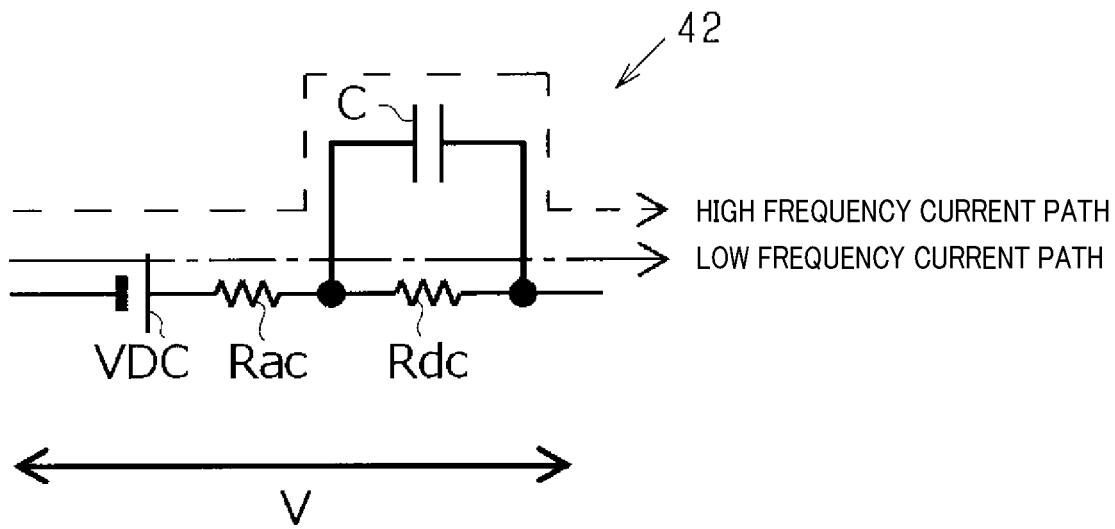
FIG. 3 is a circuit diagram illustrating an impedance model of a battery cell.

Incidentally, the impedance model of the battery cell 42 as a storage battery may be as illustrated in FIG. 3. In other words, the impedance model of the battery cell 42 may be represented by a circuit model in which a resistance Rac (electrolyte resistance) and a resistance Rdc (charge transfer resistance, and the like) are connected in series to the DC voltage VDC, and a capacitor C (electric double layer and the like) is connected in parallel to the resistance Rdc.

Figure 4:
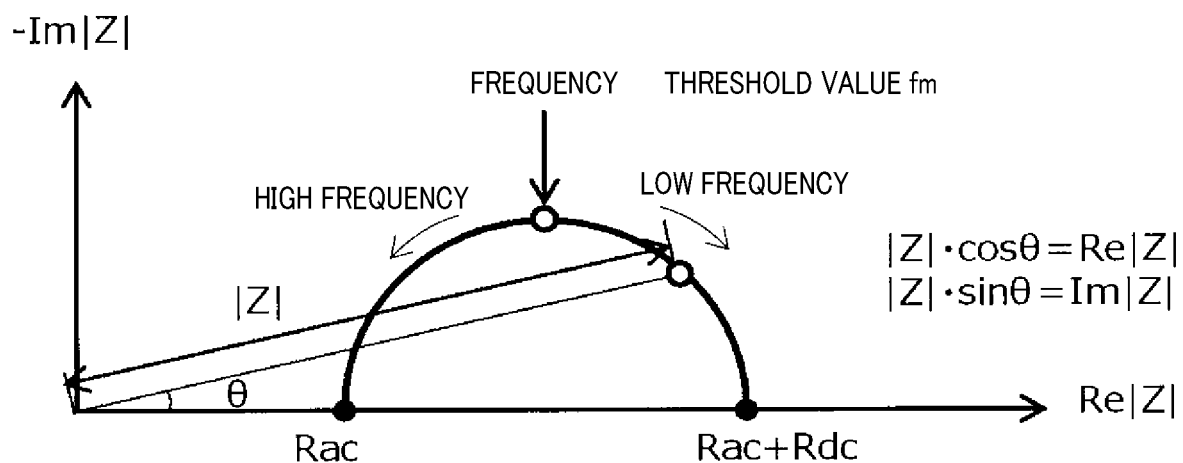
FIG. 4 is a diagram illustrating a Cole-Cole plot of a battery cell.

FIG. 4 illustrates a complex impedance characteristic (Cole-Cole plot) in this impedance model. The complex impedance may be specified by the absolute value |Z| thereof and the phase θ of the current voltage, and drawn in a semicircle. Note that in FIG. 4, the higher the frequency of the AC signal that is applied, the smaller the real part Re |Z| of the complex impedance becomes, and the lower the frequency that is applied, the larger the real part Re |Z| becomes.

In the Cole-Cole plot, the values used as the control index in the battery control are generally the resistance Rac and the resistance Rdc. For example, the resistances Rac, Rdc are used as indexes when determining the deterioration state of the battery cell 42, and the resistance Rac that contributes to the voltage fluctuation at the time of sudden current change is used during inrush current control.

Here, the inventors have found that, in a case where a rectangular wave signal is applied instead of a sinusoidal current, the resistance Rac and the resistance Rdc used as the control indexes may be detected accurately with good precision. The principle of that will be described.

Figure 5A:
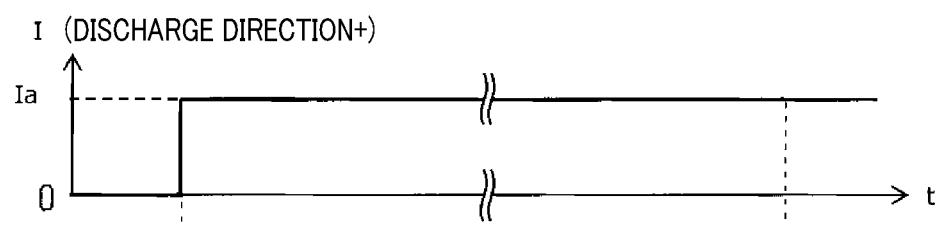
FIGS. 5A and 5B are diagrams for explaining voltage fluctuations when a rectangular wave signal is passed through a battery cell.
Figure 5B:
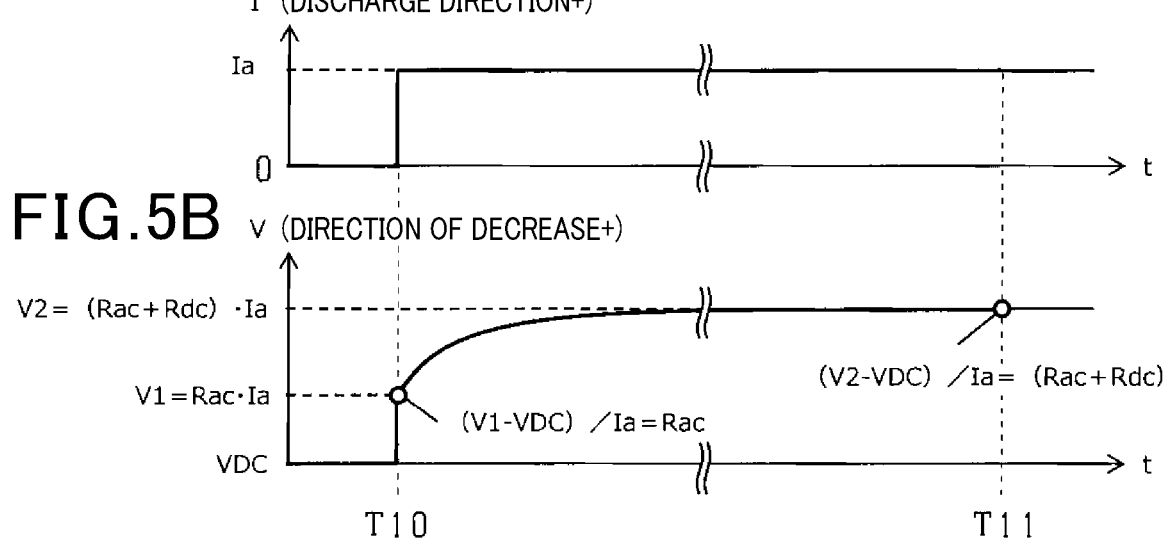

As illustrated in FIG. 5A, the current value (amplitude) changes from "0" to "Ia" at the instant (time T10) when the rectangular wave signal is applied to the battery cell 42. At time T10, the rectangular wave signal becomes a high frequency current, so as illustrated in FIG. 3, the current flows through a high frequency current path (indicated by a broken line) that passes through the resistor Rac and the capacitor C. Therefore, as illustrated in FIG. 5B, the voltage value of the voltage fluctuation portion of the inter-terminal voltage V (DC voltage VDC+voltage fluctuation portion) at time T10 becomes equal to the voltage value "V1" of the voltage fluctuation portion obtained by multiplying the resistance Rac by the current value "Ia" of the rectangular wave signal. Note that, in FIG. 5A, the discharging direction is illustrated to be the + side. Moreover, in FIG. 5B, the direction in which the voltage decreases is illustrated to be the + side.

After that, in a case where the rectangular wave signal is kept flowing, the inter-terminal voltage V gradually increases and converges to a constant value (time T11). At time T11, the rectangular wave signal is a low frequency current, so as illustrated in FIG. 3, the current flows through the low-frequency current path (indicated by the dash-dot line) that passes through the resistors Rac, Rdc without passing through the capacitor C. Therefore, the voltage value of the voltage fluctuation portion of the inter-terminal voltage V (DC voltage VDC+voltage fluctuation portion) at time T11 becomes equal to the voltage value "V2" of the voltage fluctuation portion obtained by multiplying the total value of the resistance Rac and the resistance Rdc (resistance Rac+resistance Rdc) by the current value "Ia" of the rectangular wave signal.

Based on the principle described above, the resistance Rac may be measured when the frequency of the rectangular wave signal is sufficiently high, or in other words, in a case where the application time of the rectangular wave signal is short. The total value Rtotal of the resistance Rac and the resistance Rdc may be measured when the frequency of the rectangular wave signal is sufficiently low, or in other words, in a case where the application time of the rectangular wave signal is long.

Generally, in a case where a rectangular wave signal flows, the oscillation circuit may be made smaller than in a case where a sinusoidal current flows. Therefore, in this embodiment, the complex impedance is calculated using a rectangular wave signal. Hereinafter, the configuration of the lock-in amplifier 53 and the impedance calculation process will be described in detail.

Figures 6A, 6B, 6C, 6D, 6E, 6F, 6G, 6H:
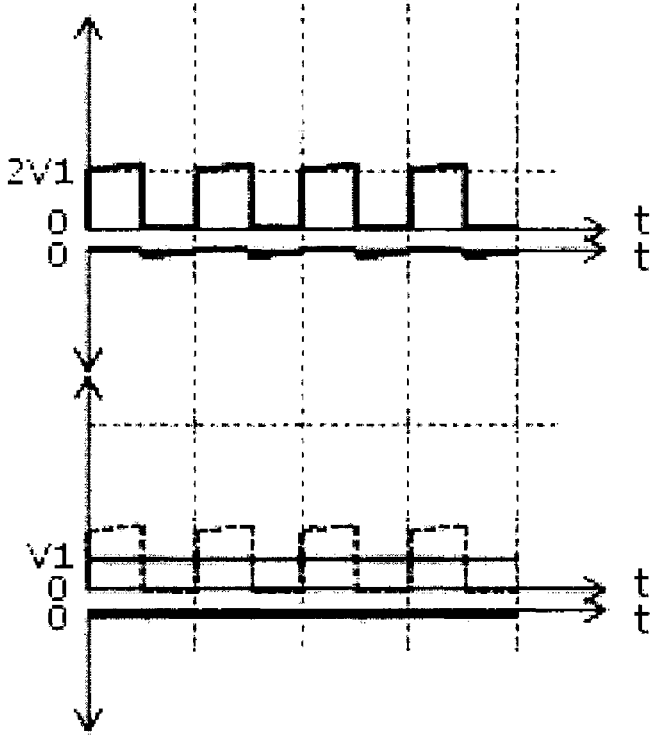
FIGS. 6A to 6H are timing charts illustrating changes in voltage and current when calculating complex impedance.
Figures 8A, 8B, 8C, 8D, 8E, 8F, 8G, 8H:
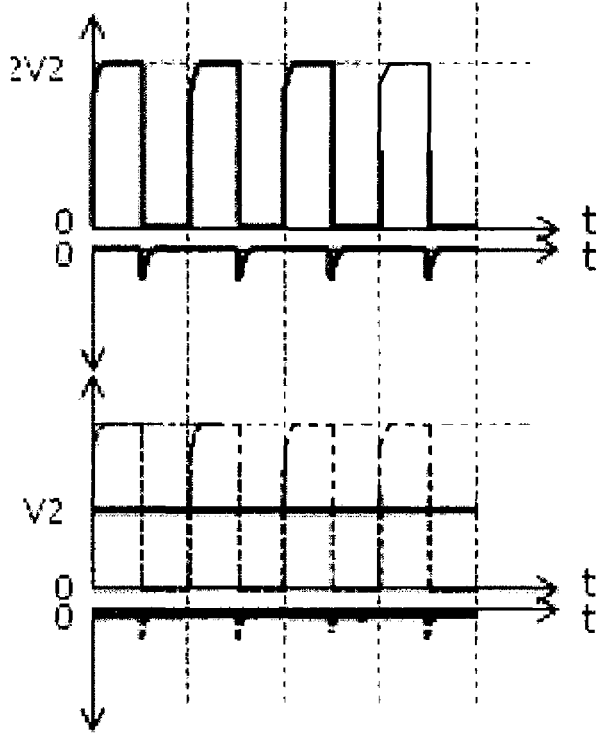
FIGS. 8A to 8H are timing charts illustrating changes in voltage and current when calculating complex impedance.

First, the configuration of the lock-in amplifier 53 will be described. As illustrated in FIG. 2, the lock-in amplifier 53 is provided with an oscillator 60 as a signal generating unit. The oscillator 60 is configured to instruct the equalization circuit 52 to output the AC signal I, which is an AC current, from the battery cell 42. In the present embodiment, the AC signal I is a rectangular wave signal having a duty ratio of 1/2 and an amplitude (maximum current value) of "Ia" as illustrated in FIG. 6A, FIG. 7A and FIG. 8A. The oscillator 60 outputs an instruction signal S1 to the semiconductor switching element 56a of the equalization circuit 52 for performing ON/OFF control so that the battery cell 42 outputs the AC signal I. Note that the measurement frequency f (cycle T) of the AC signal I is instructed by a calculation unit 64 described later.

In addition, the oscillator 60 is configured to output a notification signal S2 that notifies whether the AC signal I is being outputted from battery cell 42. The notification signal S2 is outputted (switched to a high state) when the battery cell 42 is not outputting the AC signal I.

Moreover, the oscillator 60 is configured so as to output a first reference signal Ref1. As illustrated in FIG. 6B, FIG. 7B and FIG. 8B, the first reference signal Ref1 is a rectangular wave signal having a duty ratio of 1/2 and an amplitude of "2". In addition, the first reference signal Ref1 is configured so as to be outputted in synchronization with the AC signal I. In other words, the first reference signal Ref1. as with the AC signal I, is switched between the high state and the low state. Note that in the first reference signal Ref1, the high state is when the amplitude is "2", and the low state is when the amplitude is "0".

Moreover, the oscillator 60 is configured so as to output a second reference signal Ref2. As illustrated in FIG. 6C, FIG. 7C and FIG. 8C, the second reference signal Ref2 is a rectangular wave signal having a duty ratio of 1/2 and an amplitude of "−2". In addition, the second reference signal Ref2 is shifted in phase with respect to the first reference signal Ref1 (and the AC signal I) so that the output timing (the timing of becoming the high state) does not overlap. In other words, the second reference signal Ref2 is switched so as to be in the low state when the first reference signal Ref1 (and the AC signal I) is in the high state, and so as to be in the high state when the first reference signal Ref1 is in the low state. Note that in the second reference signal Ref2, the high state is when the amplitude is "−2", and the low state is when the amplitude is "0". More specifically, the phase of the second reference signal Ref2 is shifted by 90 degrees (1/2 cycle phase) with respect to the first reference signal Ref1.

Moreover, the lock-in amplifier 53 is provided with a sample hold circuit 61, an integrator 62, and a filter 63. The sample hold circuit 61 is configured so as to input the inter-terminal voltage V of the battery cell 42 via the differential amplifier circuit 51 and output that voltage to the integrator 62 at a predetermined timing. The predetermined timing is a timing at which detection necessary for calculating the complex impedance is not performed, and more specifically, is a timing at which the notification signal S2 is inputted. In other words, it is the timing when disturbance (AC signal) is not injected into the battery cell 42.

The integrator 62 is configured to average the inputted inter-terminal voltage V and output the averaged voltage V to the outside of the lock-in amplifier 53 (to the ECU 100 or the like) or the calculation unit 64 (to be described later) via the filter 63. The value that is outputted via the filter 63 is the DC voltage VDC. As described above, in the present embodiment, the function of acquiring the DC voltage VDC of the battery cell 42 is achieved by the differential amplifier circuit 51 and the sample hold circuit 61. Therefore, the differential amplifier circuit 51 and the sample hold circuit 61 form a voltage acquiring unit.

Moreover, the lock-in amplifier 53 is provided with a subtractor 65, multipliers 66, 67, integrators 68, 69, and filters 70, 71. The subtractor 65 is configured so as to input the inter-terminal voltage V of the battery cell 42 via the differential amplifier circuit 51 in a case where the AC signal I is outputted from the battery cell 42 when calculating the complex impedance. The subtractor 65 is configured so as to subtract the DC voltage VDC from the inputted inter-terminal voltage V and extract the voltage fluctuation of the battery cell 42, and output the voltage fluctuation of the battery cell 42 as the response signal Va to each of the multipliers 66, 67. The value of the DC voltage VDC is configured so as to be acquired at the predetermined timing described above and so as to be inputted (instructed) from the calculation unit 64. Accordingly, it is possible to acquire the response signal Va as the voltage fluctuation of the battery cell 42 such as illustrated in FIG. 6D, FIG. 7D and FIG. 8D, or in other words, it is possible to acquire a value obtained by subtracting the DC voltage VDC from the inter-terminal voltage V. Therefore, the differential amplifier circuit 51 and the subtractor 65 function as a response signal acquiring unit.

The multiplier 66 multiplies the first reference signal Ref1 outputted from the oscillator 60 and the response signal Va inputted from the subtractor 65, and outputs the calculation result to the integrator 68. As a result, as illustrated in FIG. 6E, FIG. 7E and FIG. 8E, the multiplication value X obtained by multiplying the value (response signal Va) obtained by subtracting the DC voltage VDC from the inter-terminal voltage V by the first reference signal Ref1"= (V−VDC)×Ref1" may be acquired.

The integrator 68 averages the values inputted from the multiplier 66 and outputs the averaged value to the calculation unit 64 via the filter 70. The value (Average (X)) outputted from the filter 70 to the calculation unit 64 is as illustrated in FIG. 6G, FIG. 7G and FIG. 8G. The value outputted from the filter 70 to the calculation unit 64 is a value that is proportional to the real part Re |Z| of the complex impedance.

Similarly, the multiplier 67 multiplies the second reference signal Ref2 outputted from the oscillator 60 and the response signal Va inputted from the subtractor 65, and outputs the calculation result to the integrator 69. As a result, as illustrated in FIG. 6F, FIG. 7F and FIG. 8F, the multiplication value Y obtained by multiplying the value (response signal Va) obtained by subtracting the DC voltage VDC from the inter-terminal voltage V by the second reference signal Ref2"=(V−VDC)×Ref2" may be acquired.

The integrator 69 averages the values inputted from the multiplier 67 and outputs the averaged value to the calculation unit 64 via the filter 71. The value (Average (Y)) that is outputted from the filter 71 to the calculation unit 64 is as illustrated in FIG. 6H, FIG. 7H and FIG. 8H. The value outputted from the filter 71 to the calculation unit 64 is a value proportional to the imaginary part Im |Z| of the complex impedance.

In addition, the lock-in amplifier 53 is provided with the calculation unit 64. The calculation unit 64 is a calculating device (microcomputer or the like) including a CPU, a memory (RAM, ROM), and the like, and is configured so as to be able to execute various arithmetic processes.

When the DC voltage VDC is inputted via the filter 63, the calculation unit 64 is configured so as to store the DC voltage VDC in a storage unit. In addition, the calculation unit 64 is configured so as to instruct the subtractor 65 of the value of the DC voltage VDC when calculating the complex impedance.

Moreover, the calculation unit 64 is configured so as to determine the measurement frequency f of the AC signal I from within a predetermined frequency range and instruct the oscillator 60. The calculation unit 64 then acquires a value proportional to the real part of the complex impedance and a value proportional to the imaginary part thereof from the filters 70, 71, and calculates the complex impedance based on these values and the current value "Ia" of the AC signal I. More specifically, the calculation unit 64 calculates at least one or all of the real part Re |Z|, the imaginary part the absolute value |Z|, and the phase θ of the complex impedance.

Moreover, the calculation unit 64 is configured so as to specify the resistance Rac and the resistance Rdc based on the real part Re |Z|, the imaginary part Im |Z|, the absolute value |Z|, and the phase θ of the complex impedance. The calculation unit 64 is then configured externally output the calculation result such as to the ECU 100 or the like.

Next, the flow of the measurement process executed by the battery monitoring device 50 at predetermined cycles will be described with reference to FIG. 9.

The calculation unit 64 determines whether to detect (calculate) the complex impedance (step S100). For example, in a case where a complex impedance calculation command is inputted from the outside (from the ECU 100 or the like), the calculation unit 64 determines to calculate the complex impedance. Note that in a case of a predetermined timing (for example, when the ignition is turned ON, or the like), the calculation unit 64 may determine to calculate the complex impedance.

In a case where the determination result in step S100 is negative, the calculation unit 64 instructs the oscillator 60 to stop the current (step S121). In other words, the calculation unit 64 instructs the oscillator 60 to stop the output of the AC signal I.

After receiving the instruction described above, the oscillator 60, together with stopping output of the AC signal I from the battery cell 42 by stopping output of the instruction signal S1, stops output of the first reference signal Ref1 and the second reference signal Ref2 (step S122). On the other hand, the oscillator 60 outputs the notification signal S2 to the sample hold circuit 61 when the output of the AC signal I is stopped.

Next, the lock-in amplifier 53 receives the inter-terminal voltage V of the battery cell 42 via the differential amplifier circuit 51 (step S123). At this time, there is no disturbance injected into the battery cell 42 (the AC signal I is not outputted), so theoretically, the inter-terminal voltage V does not include a voltage fluctuation (response signal Va).

The average value of the inter-terminal voltage V is then calculated via the sample hold circuit 61, the integrator 62, and the filter 63, and the calculation unit 64 inputs the average value "Average (V)" (step S124). The calculation unit 64 stores the inputted average value as the DC voltage VDC (step S125). In addition, the calculation unit 64 calculates the current value "Ia" of the current (AC signal I) flowing in the battery cell 42 by dividing the DC voltage VDC by the resistance value R of the resistor 56b (step S126).

As described above, the lock-in amplifier 53 detects the DC voltage VDC by the processes of steps S121 to S125 when no disturbance is applied to the battery cell 42. Moreover, the current value "Ia" of the current flowing in the battery cell 42 is acquired.

On the other hand, when the determination result of step S100 is affirmative, the calculation unit 64 sets the maximum value fmax among the frequencies within the predetermined measurement range as the measurement frequency f (step S101). The measurement range is a range corresponding to the time constant according to the resistance Rac, the resistance Rdc, and the capacitor C in the battery cell 42, and is the range in which the resistance Rac and the resistance Rdc may be calculated. This range is determined, for example, by experiment or the like.

Next, the calculation unit 64 instructs the oscillator 60 to output the AC signal I from the battery cell 42 (step S102). At this time, the calculation unit 64 instructs to output the AC signal I having the measurement frequency f set in step S101 or step S110. When the instruction is inputted from the calculation unit 64, the oscillator 60 outputs an instruction signal S1 to the equalization circuit 52 that causes the battery cell 42 to output the AC signal I (rectangular wave signal) of the instructed measurement frequency f. Accordingly, ON/OFF control of the semiconductor switching element 56a of the equalization circuit 52 is performed based on the instruction signal S1 so that the AC signal I is outputted from the battery cell 42. By the process of this step S102, the AC signal I flows into the battery cell 42 such as illustrated in FIG. 6A, FIG. 7A and FIG. 8A.

In addition, the oscillator 60 outputs the first reference signal Ref1 and the second reference signal Ref2 of the measurement frequency f (step S103). By the process of this step S103, the first reference signal Ref1 having the measurement frequency f as illustrated in FIG. 6B, FIG. 7B and FIG. 8B and the second reference signal Ref2 as illustrated in FIG. 6C, FIG. 7C and FIG. 8C are outputted.

Figure 10:
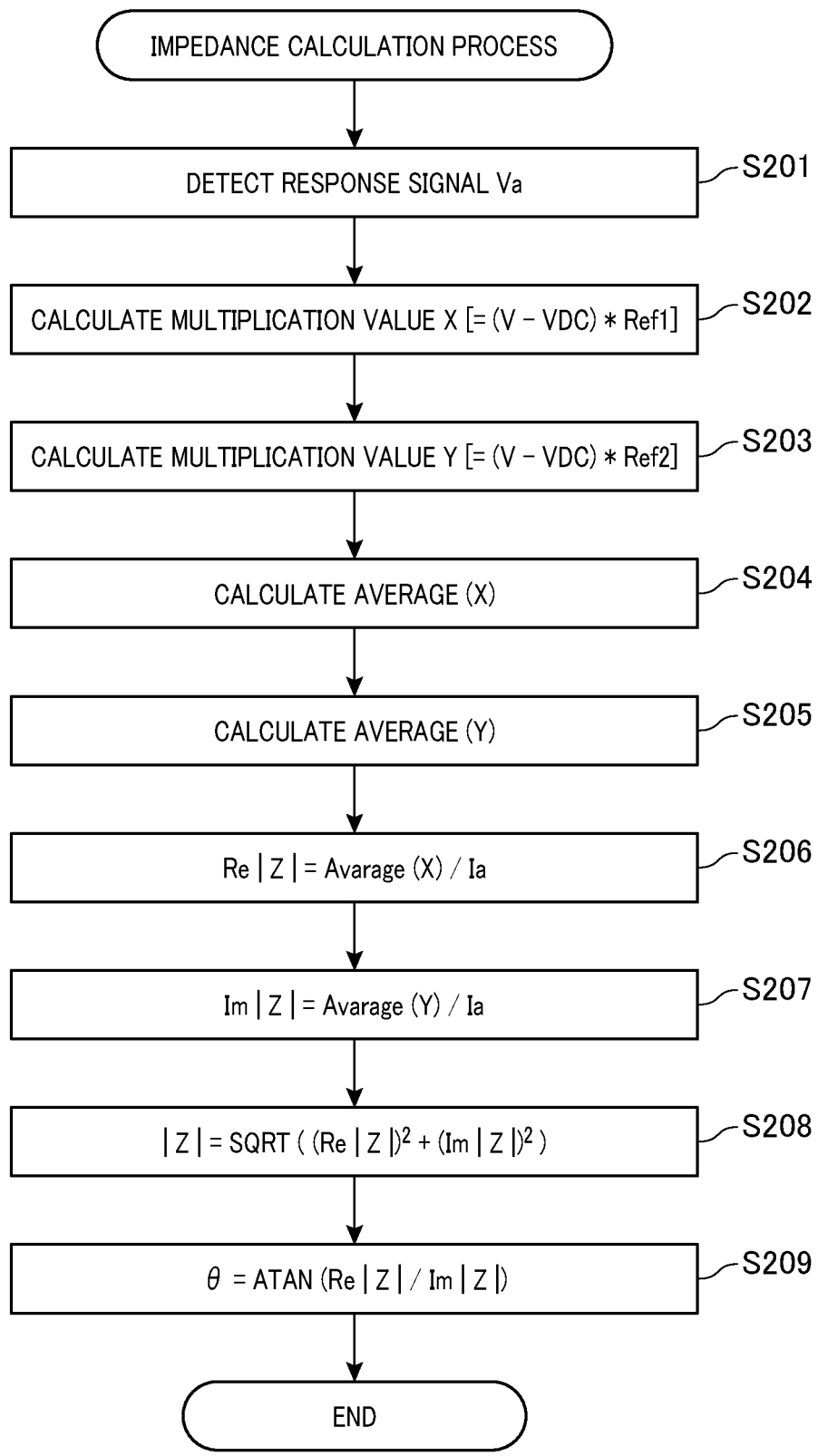
FIG. 10 is a flowchart illustrating the flow of an impedance calculation process.

Then, when the AC signal I is outputted from the battery cell 42, the lock-in amplifier 53 executes the impedance calculation process illustrated in FIG. 10 (step S104). Here, the impedance calculation process will be described with reference to FIG. 10.

When the AC signal I is outputted from the battery cell 42, the lock-in amplifier 53 acquires (detects) a voltage fluctuation of the battery cell 42 with respect to the AC signal I as a response signal Va (step S201). More specifically, the lock-in amplifier 53 acquires the inter-terminal voltage V via the differential amplifier circuit 51 when the AC signal I is outputted from the battery cell 42. Note that the inter-terminal voltage V includes a voltage fluctuation reflecting the internal impedance information, so the lock-in amplifier 53 acquires the inter-terminal voltage V at a continuous value or at a sampling frequency (for example, f×100) sufficiently higher than the measurement frequency f. In other words, the lock-in amplifier 53 acquires the inter-terminal voltage V at a frequency at which the voltage fluctuation of the battery cell 42 may be recognized when the AC signal I is outputted from the battery cell 42.

Then, the subtractor 65 of the lock-in amplifier 53 subtracts the DC voltage VDC from the acquired inter-terminal voltage V, extracts the voltage fluctuation portion of the inter-terminal voltage V, and acquires the response signal Va. In other words, the subtractor 65 acquires the response signal Va"=V−VDC" such as illustrated in FIG. 6D, FIG. 7D and FIG. 8D. The response signal Va is outputted to the multipliers 66, 67. Note that the value stored in step S125 is designated by the calculation unit 64 as the DC voltage VDC.

Then, the multiplier 66 of the lock-in amplifier 53 multiplies the response signal Va (the value of V−VDC) by the first reference signal Ref1 to calculate the multiplication value X (step S202). In the process of this step S202, the multiplication value X that is (V−VDC)×Ref1 such as illustrated in FIG. 6E, FIG. 7E and FIG. 8E is calculated. The multiplication value X is outputted to the integrator 68.

Similarly, the multiplier 67 of the lock-in amplifier 53 multiplies the response signal Va (the value of V−VDC) by the second reference signal Ref2 to calculate the multiplication value Y (step S203). In the process of this step S203, the multiplication value Y"=(V−VDC)×Ref2" such as illustrated in FIG. 6F, FIG. 7F and FIG. 8F is calculated. The multiplication value Y is outputted to the integrator 69.

Moreover, the average value "Average (X)" of the multiplication value X is calculated by the integrator 68 of the lock-in amplifier 53, and is inputted to the calculation unit 64 via the filter 70 (step S204). In the process of this step S204, Average (X) such as illustrated in FIG. 6G FIG. 7G and FIG. 8G is inputted. Note that for the convenience of calculating the average value "Average (X)" with the duty ratio being 1/2, the amplitude of the first reference signal Ref1 is set to "2".

Similarly, the average value "Average (Y)" of the multiplication value Y is calculated by the integrator 69 of the lock-in amplifier 53, and is inputted to the calculation unit 64 via the filter 71 (step S205). In the process of this step S205, Average (Y) such as illustrated in FIG. 6H, FIG. 7H and FIG. 8H is inputted. Note that for the convenience of calculating the average value "Average (Y)" with the duty ratio being 1/2, the amplitude of the second reference signal Ref2 is set to "2".

The calculation unit 64 then divides the inputted Average (X) by the current value "Ia" of the alternating current (AC signal I) flowing in the battery cell 42 to calculate the real part Re |Z| of the complex impedance (step S206). Note that the value calculated in step S126 is used as the current value "Ia".

Similarly, the calculation unit 64 divides the inputted Average (Y) by the current value "Ia" of the current (AC signal I) flowing in the battery cell 42 to calculate the imaginary part Im |Z| of the complex impedance (step S207). Similar to as described above, the value calculated in step S126 is used as the current value "Ia".

Then, the calculation unit 64 calculates the absolute value |Z| based on the real part Re |Z| and the imaginary part Im |Z| of the complex impedance (step S208). In addition, the calculation unit 64 calculates the phase θ based on the real part Re |Z| and the imaginary part Im |Z| of the complex impedance (step S209). Then, the impedance calculation process ends.

Figure 9:
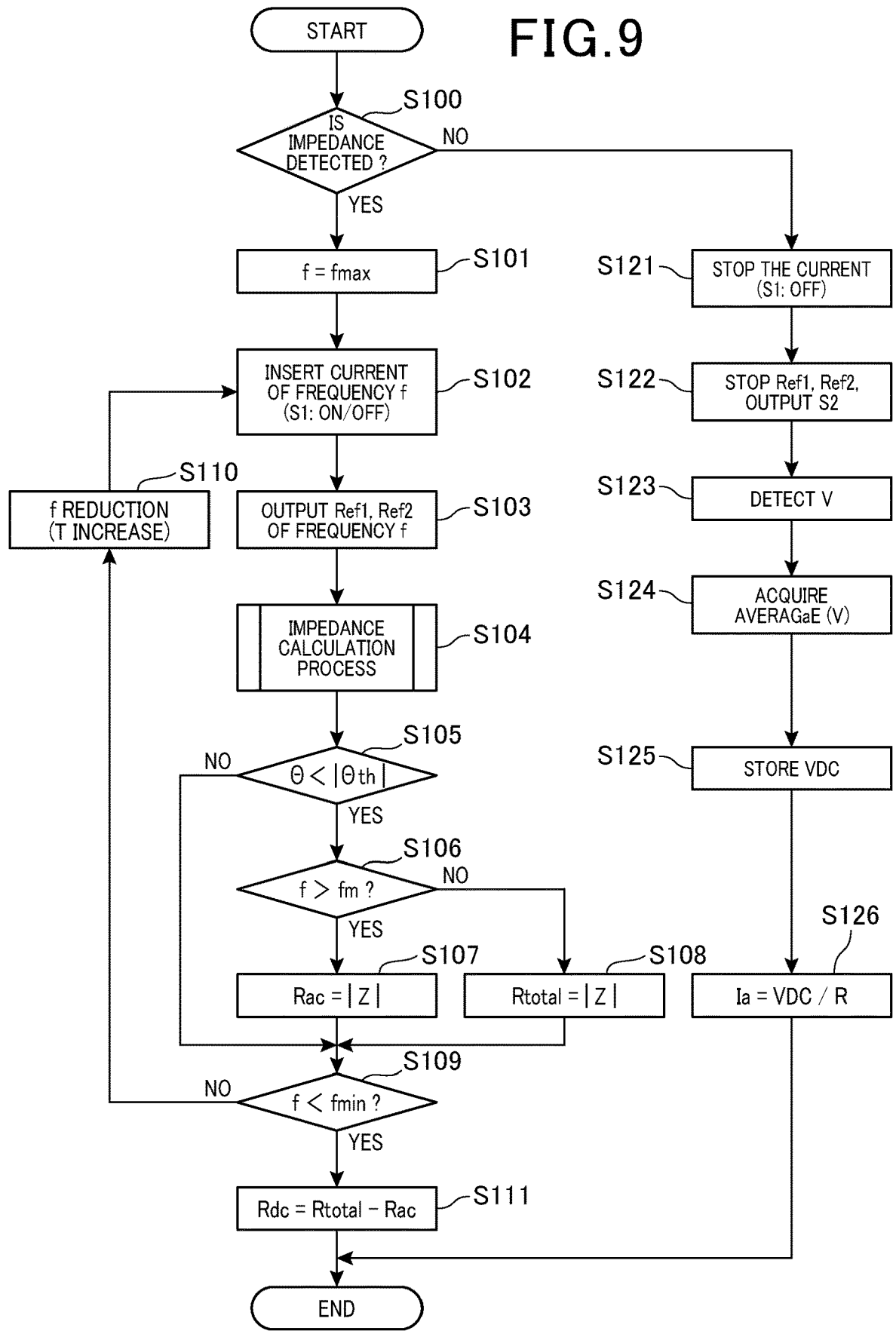
FIG. 9 is a flowchart illustrating the flow of a measurement process.

The description will return to the flowchart illustrated in FIG. 9. The calculation unit 64 determines whether the phase θ calculated in step S209 is smaller than a predetermined phase threshold value |θth| of the phase θ (step S105). The phase threshold value |θth| is a threshold value for determining whether the phase θ is a value close to zero. The phase threshold value |θth| is set to a value close to zero in consideration of a design tolerance such as a detection error. In a case where the phase θ is zero (in other words, in a case where the imaginary part Im |Z| of the complex impedance is zero), the real part Re |Z| of the complex impedance, as illustrated in FIG. 4, corresponds to the resistance Rac or the total value Rtotal of the resistances Rac and Rdc in the impedance model of the battery cell 42. Therefore, in step S105, it is determined whether the resistance Rac or the total value Rtotal is acquired.

In a case where the determination result of step S105 is affirmative, the calculation unit 64 determines whether the measurement frequency f is higher than a frequency threshold value fm (step S106). The frequency threshold value fm may be represented by Equation (1) that is the reciprocal of the time constant determined by the resistance value and the capacitor capacitance of the impedance model of the battery cell 42.

$$fm \approx (Rac+Rdc)/(2\Pi \times C \times Rac \times Rdc) \quad (1)$$

When the measurement frequency f is the frequency threshold value fm, as illustrated in FIG. 4, certainly the phase θ is greater than zero, and is between the frequency that becomes the resistance Rac and the frequency that becomes the total value Rtotal of the resistance Rac and the resistance Rdc. Therefore, in a case where the phase θ is zero and the measurement frequency f is higher than the frequency threshold value fm, it can be determined that the absolute value |Z| of the complex impedance corresponds to the resistance Rac. On the other hand, in a case where the phase θ is zero and the measurement frequency f is smaller than the frequency threshold value fm, it can be determined that the absolute value |Z| of the complex impedance corresponds to the total value Rtotal.

Therefore, in a case where the determination result of step S106 is affirmative, the calculation unit 64 sets (stores) the absolute value |Z| of the complex impedance as the resistance Rac (step S107). On the other hand, in a case where the determination result of step S106 is negative, the calculation unit 64 sets (stores) the absolute value |Z| of the complex impedance as the total value Rtotal (step S108).

Then, in a case where the determination result of step S105 is negative, or after the processes of steps S106 and S108, the calculation unit 64 determines whether the measurement frequency f is smaller than the minimum value fmin among the frequencies within the measurement range (step S109).

In a case were the determination result is negative, the calculation unit 64 reduces the measurement frequency f by a predetermined value (lengthens the cycle T) and sets the reduced value as a new measurement frequency f (step S110). Then, the calculation unit 64 proceeds to step S102.

On the other hand, in a case where the determination result of step S109 is affirmative, the calculation unit 64 subtracts the resistance Rac from the total value Rtotal to calculate the resistance Rdc (step S111). In other words, in a case where the complex impedance is calculated at each frequency within the measurement range, the calculation unit 64 sets the stored resistance Rac as the true value. Similarly, the calculation unit 64 sets the stored total value Rtotal as the total value Rtotal of the resistance Rac and the resistance Rdc, and calculates the resistance Rdc. In addition, the calculation unit 64 outputs the calculated resistance Rac and resistance Rdc to the outside such as to the ECU 100 or the like. The measurement process then ends.

Next, how the lock-in amplifier 53 measures a value proportional to the real part and a value proportional to the imaginary part of the complex impedance will be described with reference to FIGS. 6A to 8H.

First, a case in which the measurement frequency f is larger than the frequency threshold value fm and the phase θ of the complex impedance becomes zero will be described with reference to FIGS. 6A to 6H. As illustrated in FIGS. 6A and 6B, the AC signal I of the measurement frequency f is outputted from the battery cell 42, and the first reference signal Ref1 is synchronized with the AC signal I and outputted from the oscillator 60. Together with this, as illustrated in FIG. 6C, the second reference signal Ref2 is outputted from the oscillator 60 with the phase shifted so as not to overlap with the first reference signal Ref1.

At this time, the inter-terminal voltage V of the battery cell 42 fluctuates due to the effect of the AC signal I. The inter-terminal voltage V including the voltage fluctuation is inputted to the lock-in amplifier 53 via the differential amplifier circuit 51. Then, the subtractor 65, by subtracting the DC voltage VDC from the inter-terminal voltage V, acquires the voltage fluctuation portion of the inter-terminal voltage V as the response signal Va such as illustrated in FIG. 6D. As illustrated in FIG. 6D, in a case where the measurement frequency f is large, the response signal Va becomes a signal substantially similar to the rectangular wave signal. In other words, when the AC signal I is in the high state, the value of the response signal Va is the voltage value "V1", and when the AC signal I is in the low state, the value of the response signal Va is zero. Note that in FIG. 6D, the direction of the voltage drop is illustrated to be positive.

The multiplier 66 then outputs the multiplication value X obtained by multiplying the response signal Va by the first reference signal Ref1 such as illustrated in FIG. 6E. Note that the amplitude of the first reference signal Ref1 is "2", so the response signal Va is outputted after being doubled. In other words, when the response signal Va and the first reference signal Ref1 are in the high state, the voltage value "2V1" is outputted as the multiplication value X, and when the response signal Va and the first reference signal Ref1 are in the low state, the multiplication value X is outputted as zero.

Moreover, the multiplier 67 outputs a multiplication value Y obtained by multiplying the response signal Va by the second reference signal Ref2 such as illustrated in FIG. 6F. The amplitude of the second reference signal Ref2 is "−2", so the response signal Va is outputted after being multiplied by −2. However, as illustrated in FIG. 6D, when the second reference signal Ref2 becomes "−2", the value of the response signal Va is substantially zero, so even when the second reference signal Ref2 is multiplied, the result takes a value of substantially zero.

The integrator 68 outputs Average (X) that is the average value of the multiplication values X, and is a value proportional to the real part of the complex impedance. At this time, the multiplication value X is averaged such as illustrated in FIG. 6G so the value corresponding to the voltage value "V1" in the voltage fluctuation portion continues to be outputted.

On the other hand, the integrator 69 outputs Average (Y) that is the average value of the multiplication values Y, and is a value proportional to the imaginary part of the complex impedance. At this time, the multiplication value Y is averaged such as illustrated in FIG. 6H; however, a value substantially zero is continuously outputted as the multiplication value Y, so Average (Y) is also substantially zero. Accordingly, the value proportional to the imaginary part of the complex impedance is zero, and the phase θ of the complex impedance is zero.

Then, in a case where the phase θ becomes zero and the measurement frequency f is higher than the frequency threshold value fm, as described above, the voltage value "V1" in the voltage fluctuation portion corresponds to a value obtained by multiplying the current value "Ia" by the resistance Rac. Therefore, the resistance Rac may be specified from the voltage value "V1".

Next, a case in which the measurement frequency f is such that the phase θ does not become zero will be described based on FIGS. 7A to 7H. As illustrated in FIGS. 7A and 7B, the AC signal I of the measurement frequency f is outputted from the battery cell 42, and the first reference signal Ref1 is synchronized with the AC signal I and outputted from the oscillator 60. Together with this, as illustrated in FIG. 7C, the second reference signal Ref2 is outputted from the oscillator 60 with the phase shifted so as not to overlap with the first reference signal Ref1.

At this time, the inter-terminal voltage V of the battery cell 42 fluctuates due to the effect of the AC signal I. The inter-terminal voltage V including the voltage fluctuation is inputted to the lock-in amplifier 53 via the differential amplifier circuit 51. Then, the subtractor 65, by subtracting the DC voltage VDC from the inter-terminal voltage V, acquires the voltage fluctuation portion of the inter-terminal voltage V as the response signal Va such as illustrated in FIG. 7D. As illustrated in FIG. 7D, in a case where the measurement frequency f is neither large nor small, the response signal Va is such that, due to the effect of the capacitor C, even when the AC signal I is switched from the high state to the low state, the AC signal I does not immediately transition to the low state but transitions gradually. Similarly, the response signal Va is such that, due to the effect of the capacitor C, even when the AC signal I is switched from the low state to the high state, the AC signal I does not immediately transition to the high state but transitions gradually. Note that in FIG. 7D, the direction of the voltage drop is illustrated to be positive.

Therefore, the multiplication value X outputted from the multiplier 66 is as illustrated in FIG. 7E. In other words, the amplitude of the first reference signal Ref1 is "2", so when the response signal Va and the first reference signal Ref1 are in the high state, the response signal Va is doubled and outputted. On the other hand, when the response signal Va and the first reference signal Ref1 are in the low state, zero is outputted as the multiplication value X.

Moreover, the multiplication value Y that is outputted from the multiplier 67 is as illustrated in FIG. 7F. In other words, the amplitude of the second reference signal Ref2 is "−2", so when the second reference signal Ref2 is in the high state, the response signal Va is multiplied by −2 and outputted. On the other hand, when the second reference signal Ref2 is in the low state, zero is outputted as the multiplication value Y.

The integrator 68, similar to as described above, outputs Average (X), and the integrator 69 outputs Average (Y). At this time, as illustrated in FIG. 7H, Average (Y) does not become zero. In other words, it is possible to determine that the phase θ is not zero.

Next, a case in which the measurement frequency f is smaller than the frequency threshold value fm and the phase θ becomes zero will be described based on FIGS. 8A to 8H. As illustrated in FIGS. 8A and 8B, the AC signal I of the measurement frequency f is outputted from the battery cell 42, and the first reference signal Ref1 is synchronized with the AC signal I and outputted from the oscillator 60. Together with this, as illustrated in FIG. 8C, the second reference signal Ref2 is outputted from the oscillator 60 with the phase shifted so as not to overlap with the first reference signal Ref1.

At this time, the inter-terminal voltage V of the battery cell 42 fluctuates due to the effect of the AC signal I. The inter-terminal voltage V including the voltage fluctuation is inputted to the lock-in amplifier 53 via the differential amplifier circuit 51. Then, the subtractor 65, by subtracting the DC voltage VDC from the inter-terminal voltage V, acquires the voltage fluctuation portion of the inter-terminal voltage V as the response signal Va such as illustrated in FIG. 8D. As illustrated in FIG. 8D, in a case where the measurement frequency f is sufficiently small, the response signal Va becomes a signal substantially similar to a rectangular wave signal. In other words, when the AC signal I is in the high state, the value of the response signal Va is the voltage value "V2", and when the AC signal I is in the low state, the value of the response signal Va is zero. Note that in FIG. 8D, the direction of the voltage drop is illustrated to be positive.

The multiplier 66 then outputs the multiplication value X obtained by multiplying the response signal Va by the first reference signal Ref1 such as illustrated in FIG. 8E. Note that the amplitude of the first reference signal Ref1 is "2", so the response signal Va is outputted after being doubled. In other words, when the response signal Va and the first reference signal Ref1 are in the high state, the voltage value "2V2" is outputted as the multiplication value X, and when the response signal Va and the first reference signal Ref1 are in the low state, the multiplication value X is outputted as zero.

In addition, the multiplier 67 outputs a multiplication value Y obtained by multiplying the response signal Va by the second reference signal Ref2 such as illustrated in FIG. 8F. The amplitude of the second reference signal Ref2 is "−2", so the response signal Va is outputted after being multiplied by −2. However, as illustrated in FIG. 8D, when the second reference signal Ref2 becomes "−2", the value of the response signal Va is substantially zero, so even when the second reference signal Ref2 is multiplied, the result takes a value of substantially zero.

The integrator 68 outputs Average (X) that is the average value of the multiplication values X, and is a value proportional to the real part of the complex impedance. At this time, the multiplication value X is averaged such as illustrated in FIG. 8G so the value corresponding to the voltage value "VT" in the voltage fluctuation portion continues to be outputted.

On the other hand, the integrator 69 outputs Average (Y) that is the average value of the multiplication values Y, and is a value proportional to the imaginary part of the complex impedance. At this time, the multiplication value Y is averaged such as illustrated in FIG. 8H; however, a value substantially zero is continuously outputted as the multiplication value Y, so Average (Y) is also substantially zero. Accordingly, the value proportional to the imaginary part of the complex impedance is zero, and the phase θ of the complex impedance is zero.

Then, in a case where the phase θ becomes zero and the measurement frequency f is smaller than the frequency threshold value fm, and as described above, the voltage value "V2" of the voltage fluctuation portion corresponds to a value obtained by multiplying the current value "Ia" by the total value Rtotal. Therefore, the total value Rtotal may be specified from the voltage value "V2". Accordingly, in a case where the resistance Rac may be specified, the resistance Rdc may be calculated from the total value Rtotal.

Figure 11:
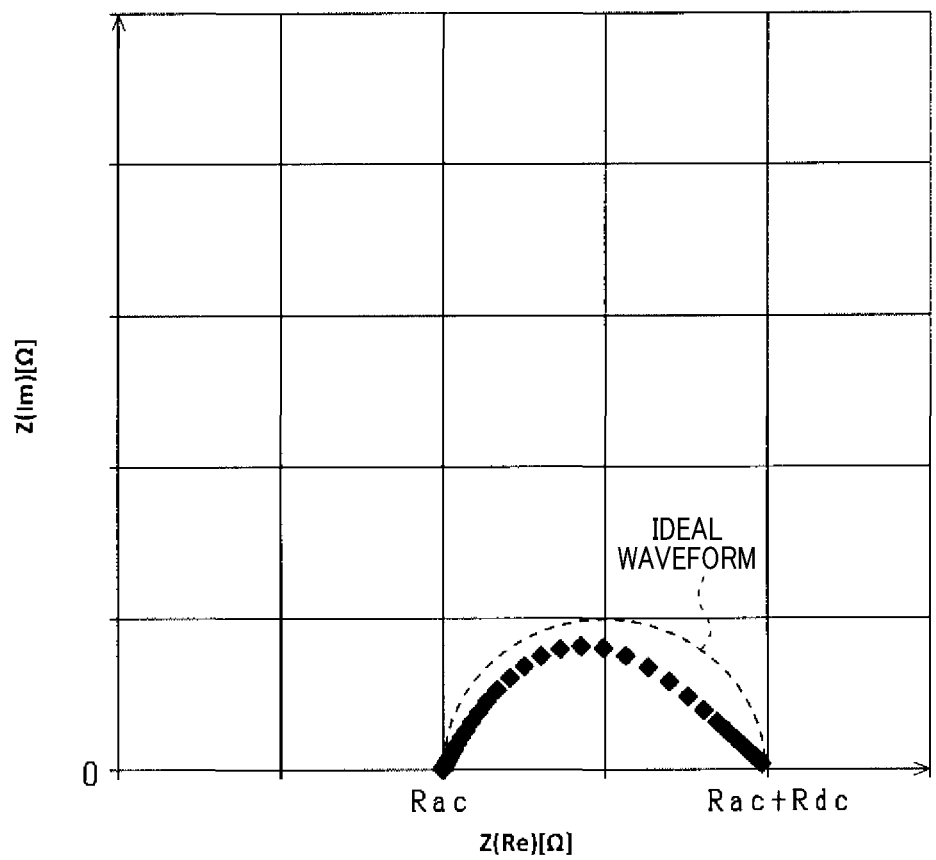
FIG. 11 is a diagram for explaining calculation accuracy of complex impedance.

As described above, the calculation accuracy in a case where the complex impedance is calculated using the rectangular wave signal will be described. In FIG. 11, the dashed line indicates an ideal complex impedance waveform. As illustrated in FIG. 11, when the phase θ is zero, or in other words, when the imaginary part Im |Z| of the complex impedance is zero, the ideal complex impedance waveform and the calculation result match. Therefore, in calculating the resistance Rac and the resistance Rdc, it can be seen that even when the rectangular wave signal is used, the same degree of calculation accuracy is obtained as when the sinusoidal current is used.

The battery monitoring device 50 of the first embodiment has the following effects.

The calculation unit 64 calculates the complex impedance of the battery cell 42 based on the multiplication value X of the response signal Va and the first reference signal Ref1 outputted in synchronization with the AC signal I, and the multiplication value Y of the response signal Va and the second reference signal Ref2 obtained by shifting the phase of the AC signal I. By so-called lock-in detection, a frequency component corresponding to the measurement frequency f is extracted from the voltage fluctuation and is acquired as the response signal Va. Therefore, monitoring becomes resistant to noise, and the calculation accuracy of the complex impedance may be improved.

Moreover, since monitoring becomes resistant to noise, it becomes possible to reduce the current outputted from the battery cell 42. Therefore, it is possible to suppress power consumption and suppress a temperature rise of the battery cell 42 and the semiconductor switching element 56a. Moreover, the filter may be made smaller.

Incidentally, the inventors found that even in a case where a rectangular wave signal is used as the AC signal I flowing in the battery cell 42 to calculate the complex impedance, there is no drop in calculation accuracy of the resistances Rac, Rdc that are control indexes of the battery cell 42 (real part Re |Z| of the complex impedance when the phase θ is zero).

Therefore, a rectangular wave signal is used as the AC signal I, the first reference signal Ref1, and the second reference signal Ref2. Accordingly, the oscillator 60 may be downsized as compared with a case in which a sinusoidal current used.

The calculation unit 64 calculates the phase θ of the complex impedance, and in a case where the phase θ of the complex impedance is smaller than the phase threshold value |θth|, specifies the resistance Rac, which is the control index, and the total value Rtotal based on the calculated complex impedance (see steps S105 to S108). Therefore, it is not necessary to perform the processes of steps S106 to S108 for all complex impedances, and the processing load may be reduced.

The equalization circuit 52 is used to output the AC signal I from the battery cell 42. Therefore, the equalization circuit 52 may be used, and the circuit may be made more compact. Moreover, the equalization circuit 52 itself is also composed of a resistor 56b and a semiconductor switching element 56a that are connected in series, so may be achieved with a simple circuit configuration.

In addition, the equalization circuit 52 uses the battery cell 42 to be monitored as a power supply and outputs the AC signal I. Therefore, an external power supply for inputting the AC signal I into the battery cell 42 is not required, and it is possible to reduce the number of parts, reduce the size, and reduce the cost.

Incidentally, peripheral circuits such as a protection element, a filter circuit and the like are generally connected to a vehicle-mounted storage battery, and even though an AC signal is inputted to the storage battery, a part of the current leaks to the peripheral circuits. In other words, in a case where the AC signal I is inputted to the battery cell 42 and the complex impedance is calculated based on the response signal, there is a problem in that an error occurs in the response signal due to an effect of the leakage current, and the detection accuracy of the complex impedance decreases.

However, in the battery monitoring device 50 of the first embodiment described above, the battery cell 42 is used as a power supply and the AC signal I is outputted, so a closed circuit may be achieved by the equalization circuit 52 and the battery cell 42. Therefore, leakage of current from the battery cell 42 may be eliminated, and an error in the response signal Va may be suppressed.

Second Embodiment

Next, a battery monitoring device 50 of a second embodiment will be described. In the impedance calculation process, in order to improve the calculation accuracy of Average (X) and Average (Y), preferably the AC signal I is outputted from the battery cell 42 for a certain period of time, and the multiplication values X, Y are repeatedly acquired. However, as illustrated in the impedance model of the battery cell 42 of FIG. 3, there is a capacitor C, so in a case where the multiplication values X, Y are repeatedly acquired to some extent, a problem such as illustrated in FIGS. 12A to 12H occurs.

In other words, as the charge is accumulated in the capacitor C, the response signal Va gradually shifts. More specifically, in a case where the maximum value of the response signal Va in one cycle is "Vmax" and the minimum value is "Vmin", the maximum value "Vmax" and the minimum value "Vmax" are set so that the charge/discharge amount of the capacitor C is balanced, and the maximum value "Vmax" and the minimum value "Vmin" converge to an intermediate value between zero and the voltage value "V2".

In such a case, as illustrated on the right end of FIGS. 12A to 12H, the multiplication value X moves upward, and as a result, the Average (X) also increases. On the other hand, the multiplication value Y decreases, and as a result, the Average (Y) does not become zero.

Therefore, in the second embodiment, the impedance calculation process is different from that of the first embodiment. In other words, the lock-in amplifier 53 is configured so as to acquire the voltage value of the battery cell 42 immediately before the start of the output cycle of the AC signal I, extract the voltage fluctuation of the inter-terminal voltage V in a case where the voltage value is used as a reference, and then set the voltage fluctuation as a response signal. The voltage value of the battery cell 42 immediately before the start corresponds to the minimum value "Vmin" in the previous cycle. Note that the output cycle is immediately before the start of the output cycle, however, may be immediately before the end of the output cycle. Hereinafter, the minimum value in the previous cycle will be referred to as reference voltage Vmin.

More specifically, the impedance calculation process illustrated in FIG. 13 is performed instead of the impedance calculation process illustrated in FIG. 9 described in the first embodiment. Here, the impedance calculation process of the second embodiment will be described.

First, when the AC signal I is outputted from the battery cell 42, the lock-in amplifier 53 acquires the inter-terminal voltage V via the differential amplifier circuit 51 (step S301). This inter-terminal voltage V includes a voltage fluctuation portion.

In addition, the calculation unit 64 acquires the inter-terminal voltage V of the battery cell 42 as the reference voltage Vmin immediately before the AC signal I becomes high (step S302). Note that the oscillator 60 is configured so as to output a notification signal S2 and input the reference voltage Vmin to the calculation unit 64 immediately before the AC signal I becomes high.

Moreover, the subtractor 65 and the multiplier 66 of the lock-in amplifier 53 subtract the reference voltage Vmin from the inter-terminal voltage V, multiply the value after subtraction by the first reference signal Ref1, and output the multiplication value X (step S303). In the process of this step S303, the value of (V−Vmin)×Ref1 is calculated as the multiplication value X. Note that in step S303, the calculation unit 64 outputs the reference voltage Vmin to the subtractor 65.

Similarly the subtractor 65 and the multiplier 67 of the lock-in amplifier 53 subtract the reference voltage Vmin from the inter-terminal voltage V, multiply the value after subtraction by the second reference signal Ref2, and output the multiplication value Y (step S304). In the process of this step S304, the value of (V−Vmin)×Ref2 is calculated as the multiplication value Y. Note that in step S304, the calculation unit 64 outputs the reference voltage Vmin to the subtractor 65.

As described above, in steps S303 and S304, the subtractor 65 extracts the voltage fluctuation of the inter-terminal voltage V with reference to the reference voltage Vmin instead of the DC voltage VDC, and outputs the extracted voltage fluctuation as a response signal (=V−Vmin).

Then, the processes of steps S305 to S310 are performed. Note that the processes starting from step S305 are the same as the processes from step S204 to step S209 described in the first embodiment, so a detailed description will be omitted.

According to the configuration of the second embodiment, even in a case where the AC signal I is outputted from the battery cell 42 for some period of time and the multiplication values X and Y are repeatedly obtained to some extent, the shift of the response signal due to the capacitor C may be corrected. Therefore, the calculation accuracy of the complex impedance may be improved.

Other Embodiments

The embodiments described above may be modified as described below.

In the embodiments described above, a battery monitoring device 50 is provided for each battery cell 42; however, a battery monitoring device 50 may be provided for each of a plurality of battery cells 42 (for example, each battery module 41, each battery pack 40). In that case, a part of the functions of the battery monitoring device 50 may be made common.

The battery monitoring device 50 of the embodiments described above may be used in a vehicle such as a REV, EV or PHV, and in auxiliary batteries, electric airplanes, electric motorcycles, and electric ships.

In the embodiments described above, the battery cells 42 may be connected in parallel.

In the embodiments described above, the ECU 100 may be configured by several ECUs. For example, a plurality of ECUs may be provided for each function, or a plurality of ECUs may be provided for each control target. For example, the ECUs may be divided into a battery ECU and an inverter control ECU.

In the embodiments described above, the current value "Ia" of the rectangular wave signal is calculated from the DC voltage VDC and the resistance value R of resistor 56b; however, a current sensor may be provided and the current value "Ia" may be specified according to the measured value of the current sensor. Accordingly, the effect due to variation in the resistance value R may be suppressed.

In the embodiments described above, the AC signal I is continuously outputted and measured during a certain cycle; however, in a case where it was determined that the phase is not zero in the first few cycles, the measurement frequency f may be changed to the next frequency. Accordingly, it is possible to reduce the time for determining the resistances Rac and Rdc.

In the first embodiment described above, the calculation of the complex impedance and the measurement of the DC voltage VDC are exclusively performed; however, the measurements may be performed simultaneously. When doing so, the accuracy of calculation of the DC voltage VDC decreases due to the effect of the internal resistance of the battery cell 42, however, the detection time may be shortened.

In the embodiments described above, the amplitudes of the first reference signal Ref1 and the second reference signal Ref2 may be changed arbitrarily.

In the embodiments described above, the duty ratio of the AC signal I may be changed arbitrarily.

The control unit and the method thereof described in the present disclosure may be achieved by a dedicated computer provided by configuring a memory and a processor programmed so as to execute one or a plurality of functions embodied by a computer program. Alternatively, the control unit and the method thereof described in the present disclosure may be achieved by a dedicated computer provided by configuring a processor with one or more dedicated hardware logic circuits. Alternatively, the control unit and the method thereof described in the present disclosure may be achieved by one or more dedicated computer configured by a combination of a memory and a processor programmed to execute one or more functions and a processor configured by one or more hardware logic circuits. Moreover, the computer program may be stored in a computer-readable non-transitory tangible recording medium as an instruction executed by a computer readable non-transitory tangible recording medium.

CONCLUSION

The present invention is to provide a battery monitoring device that may be made more compact while improving the calculation accuracy of complex impedance.

According to the present disclosure, a battery monitoring device that monitors a state of a storage battery including an electrolyte and a plurality of electrodes is provided. The battery monitoring device includes: a signal generating unit that causes an AC signal to flow in the storage battery; a response signal acquiring unit that acquires a voltage fluctuation of the storage battery when the AC signal flows as a response signal; and a calculation unit that calculates a complex impedance of the storage battery, in which the calculation unit is configured to calculate a complex impedance of the storage battery based on a multiplication value of the response signal and a first reference signal outputted in synchronization with the AC signal, and a multiplication value of the response signal and a second reference signal obtained by shifting a phase of the AC signal; the AC signal is a rectangular wave signal; the first reference signal is a rectangular wave signal outputted in synchronization with the AC signal; and the second reference signal is a rectangular wave signal, a phase thereof being shifted so as not to be outputted overlapping with the first reference signal.

In the configuration described above, the calculation unit calculates complex impedance of the storage battery based on a multiplication value of the response signal and a first reference signal outputted in synchronization with the AC signal, and a multiplication value of the response signal and a second reference signal obtained by shifting the phase of the AC signal. In other words, in the configuration described above, the method of the lock-in amplifier as described in JP 2018-190502A is used, so, according to that principle, the battery monitoring device becomes resistant to noise, and the calculation accuracy of the complex impedance may be improved. Moreover, the processing load may be reduced compared with a case in which Fourier transformation is used.

Incidentally, the inventors found that even in a case where the complex impedance is calculated by using a rectangular wave signal instead of a sinusoidal current, the calculation accuracy of the resistance component in the impedance model of a storage battery, which is the control index, or in other words, the calculation accuracy of the absolute value of the complex impedance when the phase or the imaginary part of the complex impedance is zero does not drop.

Accordingly, a rectangular wave signal is used as the AC signal and the reference signal. Therefore, it is possible to improve the accuracy of calculating the complex impedance, and make the circuit more compact in comparison with a circuit for causing a sinusoidal current to flow.

What is claimed is:

1. A battery monitoring device that monitors a state of a storage battery including an electrolyte and a plurality of electrodes, a current circuit as a series connected body composed of a resistor and a switch unit being connected to the storage battery, the battery monitoring device comprising:

a signal generating unit that switches the switch unit to be ON and OFF during a predetermined output period to cause a rectangular wave signal to be output from the storage battery to the resistor;

a response signal acquiring unit that detects a first terminal voltage of the storage battery in a period other than the predetermined output period to be a reference voltage and a second terminal voltage of the storage battery in the predetermined output period and subtracts the reference voltage from the second terminal voltage, thereby acquiring a response signal as a voltage fluctuation of the storage battery in the predetermined output period; and a calculation unit configured to:
  i) multiply, during the predetermined output period, a value of a first reference signal with a value of the response signal over time to calculate a first multiplication value;
  ii) calculate a real part value proportional to a real part of a complex impedance of the storage battery from an average value of the first multiplication value which is averaged over time;
  iii) multiply, during the predetermined output period, a value of a second reference signal with a value of the response signal over time to calculate a second multiplication value; and
  iv) calculate an imaginary part value proportional to an imaginary part of the complex impedance of the storage battery from an average value of the second multiplication value which is averaged over time, wherein the first reference signal is switched to be a high state and a low state at a timing synchronizing to a timing of the rectangular wave signal, the first reference signal being a signal of a rectangular wave, the second reference signal is switched to be a low state at a time when the first reference signal turns to a high state and switched to be a high state at a time when the first reference signal turns to a low state, the second reference signal being a signal of a rectangular wave, an equalization circuit that discharges the storage battery is connected to the storage battery, the equalization circuit discharging the storage battery according to a storage state of the storage battery, and the equalization circuit is the current circuit as the series connected body composed of the resistor and the switch unit.

2. The battery monitoring device according to claim 1, wherein the response signal acquiring unit detects, as the reference voltage, a terminal voltage of the storage battery immediately before a timing at which the rectangular wave signal is switched to be a high state from a low state.

3. The battery monitoring device according to claim 1, wherein the storage battery is represented by a circuit model in which a first resistance component Rac including no capacitance component and a second resistance component Rdc including a capacitance component are connected in series to a DC voltage, the calculation unit divides the real part value proportional to the real part of the complex impedance by a current value detected at a time when the rectangular wave signal turns to the high state to calculate the real part of the complex impedance, divides the imaginary part value proportional to the imaginary part of the complex impedance by a current value detected at a time when the rectangular wave signal turns to the high state to calculate the imaginary part of the complex impedance and calculates an absolute value and a phase in accordance with the real part and the imaginary part of the complex impedance, and the calculation unit determines that the absolute value or the real part of the calculated complex impedance corresponds to the first resistance component Rac or a total value of the first resistance component Rac and the second resistance component Rdc when the phase or imaginary part of the calculated complex impedance is smaller than a phase threshold which is close to 0 and stores the calculated complex impedance.

4. The battery monitoring device according to claim 1, claim 3, wherein the calculation unit determines that the absolute value or the real part of the calculated complex impedance corresponds to the first resistance component Rac when a measurement frequency of the rectangular wave signal is larger than a frequency threshold which is a reciprocal of a time constant determined by a resistance value and a capacitance value of the circuit model of the storage battery, and determines that the absolute value or the real part of the calculated complex impedance corresponds to the total value of the first resistance component Rac and the second resistance component Rdc when a measurement frequency of the rectangular wave signal is smaller than the frequency threshold.

5. The battery monitoring device according to claim 1, wherein a duty ratio of the rectangular wave signal is set to ½, and when an amplitude of the first reference signal is set to a positive side, an amplitude of the second reference signal is on a negative side.

* * * * *